United States Patent [19]

Bernstein

[11] Patent Number: 5,510,713
[45] Date of Patent: Apr. 23, 1996

[54] TECHNIQUE FOR SELECTIVE FAT SATURATION IN MR IMAGING

[75] Inventor: Matthew A. Bernstein, Waukesha, Wis.

[73] Assignee: General Electric Company, Milwaukee, Wis.

[21] Appl. No.: 497,132

[22] Filed: Jun. 30, 1995

[51] Int. Cl.$^6$ .................................................. G01R 33/20
[52] U.S. Cl. ............................................. 324/309; 324/307
[58] Field of Search ..................................... 324/300, 303, 324/307, 309, 310, 311, 312, 313, 314, 318, 322; 128/653.2, 653.3, 653.4

[56] References Cited

U.S. PATENT DOCUMENTS

| | | | |
|---|---|---|---|
| 4,581,582 | 4/1986 | Redington | 324/309 |
| 4,618,827 | 10/1986 | Redington et al. | 324/309 |
| 4,680,546 | 7/1987 | Dumoulin | 324/307 |
| 4,843,322 | 6/1989 | Glover | 324/309 |
| 4,885,542 | 12/1989 | Yao et al. | 324/313 |
| 5,055,789 | 10/1991 | Kondo et al. | 324/309 |
| 5,134,372 | 7/1992 | Inoue | 324/309 |
| 5,225,781 | 7/1993 | Glover et al. | 324/309 |
| 5,250,899 | 10/1993 | Listerud et al. | 324/309 |

OTHER PUBLICATIONS

Doyle et al, "A New Acquisition Mode for 2D Inflow Refreshment Angiography", Magnetic Resonance in Medicine 18, 51–62 (Mar. 1991).
M. A. Bernstein, "Flow Phenomena in MRI", Current Concepts of Magnetic Resonance (Oct. 1994).
Volk et al, "Chemical Shift–Specific Slice Selection. A New Method for Chemical Shift Imaging at High Magnetic Field", Journal of Magnetic Resonance 71, 168–174 (1987).
D. G. Nishimura, "Contrast Manipulation", Current Concepts of Magnetic Resonance, 45–49 (Oct. 1994).
D. G. Nishimura, "Time–of–Flight Angiography–Physics", Current Concepts of Magnetic Resonance, 91–96 (Oct. 1994).
Pauly et al, "Slice–Selective Excitation for Very Short $T_2$ Species", Book of Abstracts vol. 1, p. 28, SMRM (Aug. 1989).
Purdy et al, "Overlapping Traveling Saturation Bands for Background Suppression in 2–D Time–of–Flight Angiography", Proceedings of SMR vol. 2, p. 954 (Aug. 1994).
T. Dixon, "Simple Proton Spectroscopic Imaging", Radiology 153:189–194 (Oct. 1984).
Keller et al, "MR Angiography with Two–dimensional Acquisition and Three–dimensional Display", Radiology 173:527–532 (Nov. 1989).
Gomori et al, "Fat Suppression by Section–Select Gradient Reversal on Spin–Echo MR Imaging", Radiology 168:493–495 (1988).

*Primary Examiner*—Michael Tokar
*Attorney, Agent, or Firm*—James O. Skarsten; John H. Pilarski

[57] ABSTRACT

A system is provided for MR imaging wherein a volume within an imaging subject positioned with respect to the system contains both water molecules and fat tissue proximate to one another. The water molecules and fat tissue are selectively saturated by first determining whether application of a first RF excitation pulse of a first RF frequency to the volume, in association with a gradient magnetic field having a selected polarity with respect to an axis, would saturate fat tissue in a band lying closer to or farther from a selected location than a band of saturated water molecules. The first frequency comprises the sum of a center frequency and a first offset frequency having a magnitude and polarity determined by the gradient magnetic field. In the event the saturated fat band associated with the first frequency would lie farther from the specified location, a second RF pulse of a second RF frequency is instead applied to the volume to saturate fat tissue within a band lying closer to the specified location, the second RF frequency comprising the sum of the center frequency and a second offset frequency having a magnitude equal to the magnitude of the first offset frequency and a polarity opposite to the polarity thereof. The polarity of the selection gradient of the second RF pulse is similarly negated compared to the polarity of the selection gradient of the first pulse.

16 Claims, 4 Drawing Sheets

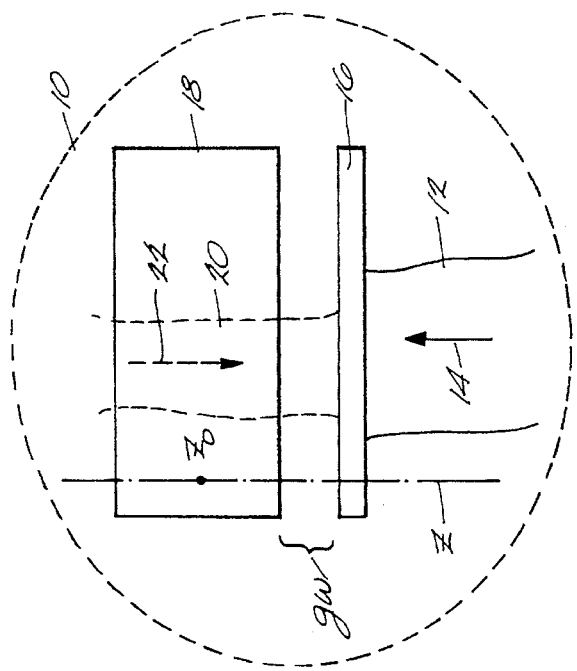
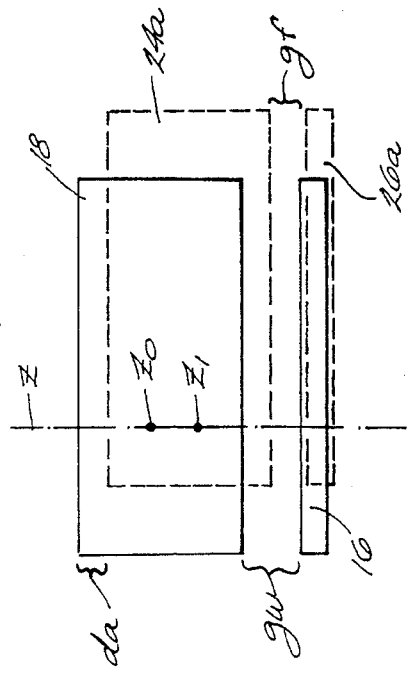
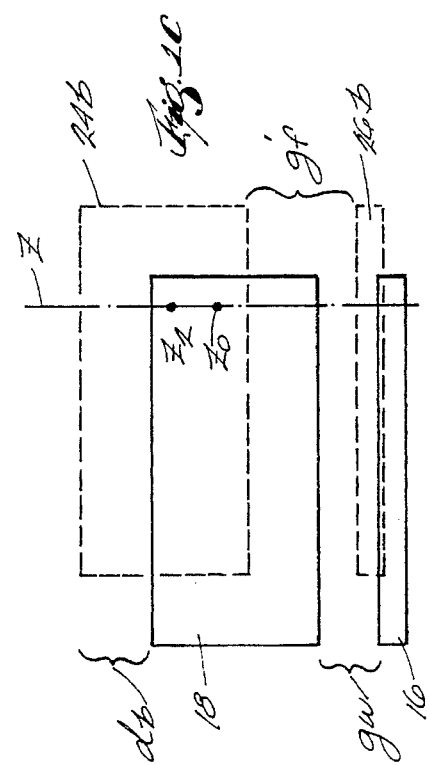
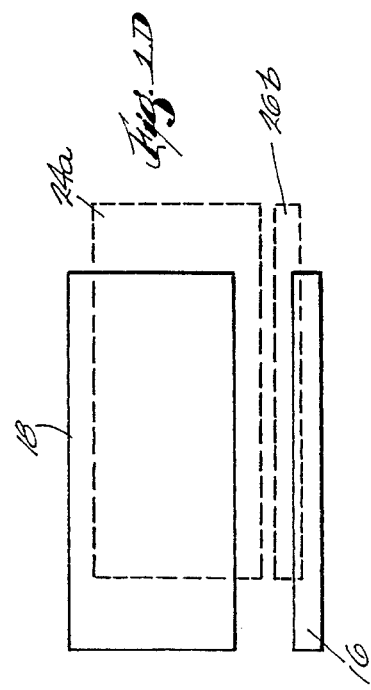

5,510,713

TECHNIQUE FOR SELECTIVE FAT SATURATION IN MR IMAGING

BACKGROUND OF THE INVENTION

The invention disclosed and claimed herein is generally directed to a method and apparatus for selectively saturating fat in a band or region in a subject of magnetic resonance (MR) imaging. More particularly, the invention pertains to selectively positioning a fat saturation band with respect to a water saturation band for applications such as two-dimensional time of flight angiography.

Two-dimensional time of flight MR angiography is among the most widely used of all MR angiographic techniques. Often it is desired to image or visualize blood flow through either arteries or veins, but not both at the same time. To achieve this, a "traveling" spatial saturation (SAT) pulse is applied at one side or the other of each of a stack of slices oriented along an axis. Often the slices are oriented substantially axially, in which case their spatial saturation band is applied either superior (cephelad) or inferior (caudal) to the imaging slice. For example, if it is desired to image the flow of blood through an artery, respective slices are selected such that blood flows through each slice. Prior to exciting a given slice for imaging, a SAT band is applied to a region spaced slightly apart from the slice, located on the outflow side of the slice. The saturation pulse prevents blood flowing toward the opposite side of the given slice, i.e., blood flowing through veins, from being detected in the MR imaging process, so that such flow does not interfere with the angiography process directed to the artery. Conversely if the aim is to image blood flow in the vein, the SAT pulse may be placed so as to suppress arterial flow.

While a SAT pulse is generally intended to saturate water molecules in a region close to a slice of interest, a band of fat tissue may also be saturated thereby. If the SAT (water) band is placed very close to the slice, e.g., within 5–10 millimeters, fat suppression can result, which is desirable since it increases blood vessel to background contrast. However, fat suppression in this application has tended to be unreliable, since fairly precise placement of the SAT pulse is required to ensure that the band in which fat is saturated either overlaps or nearly overlaps the slice of interest. Moreover, the exact location of the fat saturation band may be difficult to predict, since it is affected by the sign or polarity of the selection gradient field used in the SAT pulse sequence. In a commercial MR scanning machine, the polarity of the selection gradient, is determined by geometry factors such as the direction of the main magnetic field, the direction of patient entry into the machine (i.e. head first or feet first), and the direction of the gradient coil windings. Because of these factors, it can be very difficult to ensure that the band or region in which fat saturation occurs will be sufficiently close to the slice of interest to be of any benefit in suppressing fat from an acquired image.

SUMMARY OF THE INVENTION

The invention provides a technique for selectively saturating both water molecules and fat tissue located proximate to one another in a volume within a subject positioned with respect to an MR imaging system, the MR system having a gradient means for establishing a gradient magnetic field, and means for generating RF excitation pulses. The method includes the step of determining whether application of a first RF excitation pulse of a first RF carrier frequency to the volume, in association with a gradient magnetic field having a selected polarity with respect to an axis, would saturate water molecules lying within a first band positioned at a specified location with respect to the axis, and would saturate fat tissue lying within a second band which is spatially displaced along the axis from the specified location in a pre-specified direction rather than in a direction opposite thereto. The first RF carrier frequency comprises the sum of a center RF frequency and a first offset frequency, the magnitude and polarity of the first offset frequency being determined by the gradient magnetic field applied concurrent therewith. If the first RF pulse would displace the second (fat) band in a direction opposite to the pre-specified direction, the polarity of the gradient magnetic field is reversed from the selected polarity, and a second (replacement) RF excitation pulse of a second frequency is applied to the volume to saturate the water molecules lying within the first band, and also to saturate fat tissue lying within a third band which is likewise spatially displaced along the axis from the specified position, but in the pre-specified direction. The second RF carrier frequency comprises the sum of the center RF frequency combined with a second offset frequency, the second offset frequency having a magnitude equal to the magnitude of the first offset frequency and the opposite sign therefrom.

In a preferred embodiment of the invention, the pre-specified direction comprises the direction oriented along the axis from the specified SAT (water) band location toward a slice of interest in MR imaging. Thus, the third band will be displaced toward rather than away from the slice. Usefully, the saturated third band lies in a region which overlaps the slice. Thus, both blood flow and fat in such region will be suppressed to prevent interference thereby in an MR angiographic imaging process, such as a two-dimensional time of flight process intended to detect blood flow into the opposite side of the slice.

An object of the invention is to provide a comparatively simple technique for shifting a band of saturated fat from one side of a specifically located band of saturated water molecules to the other side thereof to enhance an MR imaging process.

Another object is to provide a technique of such type which does not displace the band of saturated water molecules from its specific location.

Another object is to provide a technique of such type for use in two-dimensional time of flight angiography, to improve fat suppression and thereby increase vessel-to-background contrast.

These and other objects of the invention will become more readily apparent from the ensuing specification, taken together with the accompanying drawings.

BRIEF DESCRIPTION OF THE DRAWINGS

FIGS. 1A–1D are schematic representations respectively illustrating bands of water and fat saturation in relation to a slice of interest in MR imaging.

DETAILED DESCRIPTION OF THE PREFERRED EMBODIMENT

Figure 2:
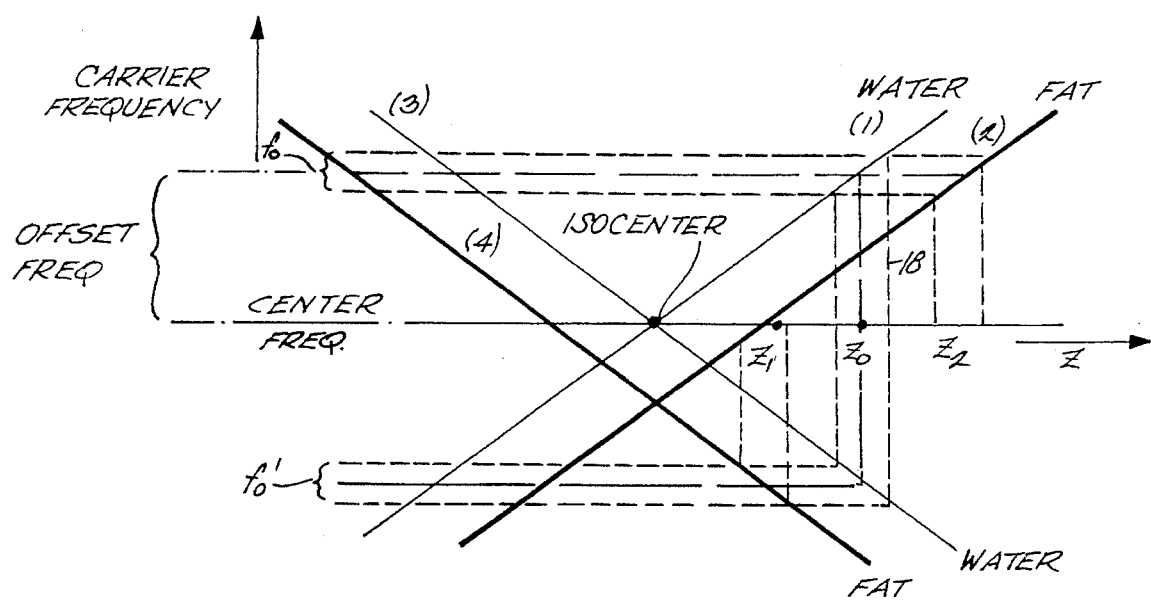
FIG. 2 shows a set of curves illustrating the invention.

Referring to FIG. 1A, there is shown a volume 10 within a patient or other subject of MR imaging (not shown in FIG.

1), volume 10 containing an artery 12 through which blood (not shown) is flowing in a direction indicated by arrow 14. The main magnet and other MR components required for MR imaging are discussed hereinafter in connection with FIG. 3. To acquire information pertaining to the flow of blood through artery 12, a succession of slices positioned substantially perpendicular to artery 12 are respectively excited, in the course of an MR angiography technique, such as two-dimensional time of flight (TOF). Slice 16 is shown in FIG. 1A as a representative slice of such succession. For illustration purposes, artery 12 is shown in FIG. 1A as being aligned along an axis Z. Respective slices are substantially axial, and therefore substantially perpendicular to the Z-axis. The current invention can operate when the slice is oriented along any direction. We simply chose Z for this description to be definite.

In accordance with the TOF angiography technique, application of an RF excitation pulse to slice 16 generates MR signal both in stationary tissue thereof and in blood flowing therethrough. The MR signal in the stationary tissue diminishes as it is subjected to repeat RF pulses, whereby significant contrast is created between the stationary tissue of slice 16 and the flowing blood, with respect to MR detection. This process is known as flow-related enhancement.

Two-dimensional time of flight MR angiography is well known to those of skill in the art, and is described in detail, for example, in an article entitled "MR Angiography with Two Dimensional Acquisition and Three-Dimensional Display: Work in Progress", Keller et al, Radiology 173:527–532 (1989).

Referring further to FIG. 1A, there is shown a band or region 18 spaced apart from slice 16. The band 18 is positioned on the outflow side of the slice 16 with respect to the artery 12. Band 18, which is separated from slice 16 by a small gap $g_w$, on the order of 5–10 millimeters, is a region to which a saturation pulse sequence pulse sequence is applied, just prior to excitation of slice 16. The saturation (SAT) pulse comprises an RF pulse having a flip angle on the order of 90 degrees or greater. Such a pulse in conjunction with dephasing gradients that follow causes MR signal in blood flowing through the saturation band 18 toward slice 16 to be greatly diminished. Thus, if blood flows toward slice 16 through a vein 20, as indicated by arrow 22, such blood would carry negligible MR signal into slice 16 to confuse the TOF angiography process directed to blood flowing in the opposite direction through artery 12. The carrier frequency of the RF pulse applied to band 18 is the Larmor frequency for water for the specified location. Hereafter, band 18 is referred to as the water saturation band. FIG. 1A shows band 18 positioned at $Z_0$ relative to the Z-axis, where $Z_0$ is the location of the center of band 18 along such axis.

Referring to FIG. 1B, there is shown a fat saturation band 24a, comprising a region in which fat tissue is saturated by the SAT pulse which saturates the water molecules in band 18, as described above. Fat saturation band 24a is shifted or displaced along the slice direction by an amount $d_a$, relative to band 18, due to the fat/water chemical shift frequency $F_{cs}$, which is on the order of 200 Hertz for a magnetic field strength of 1.5 Tesla. $d_a$ is thus related to $F_{cs}$. As is well known, the fat/water chemical shift results in a difference in the Larmor frequencies of water and fat. Water always resonates at a Larmor frequency $F_{cs}$ higher than fat. FIG. 1B shows band 24a positioned at $Z_1$ relative to the Z-axis, where $Z_1$ is the location of the center of band 24a along such axis.

FIG. 1B further shows a slice 26a, which comprises a slice of fat tissue which is excited by the same RF pulse which excites slice 16. Slice 26a is displaced along Z axis with respect to slice 16, just as band 24a is displaced from water saturation band 18, as described above. However, the saturation band is generally much more prone to chemical shift in the slice direction, i.e., along the Z axis, than the slice. Accordingly, in the case shown in FIG. 1B, where the fat saturation band 24a is displaced toward slice 16, the gap $g_f$ between fat saturation band 24a and fat slice 26 will be less than the gap $g_w$, between water saturation band 18 and slice 16. As stated above, this is very beneficial since fat is thereby suppressed in a region sufficiently close to slice 16 to significantly enhance blood vessel to background contrast.

Generally, the fat saturation gap $g_f$ is given by the following expression:

$$g_f = g_w + F_{cs}[\pm(W_s/BW_s) \pm (W_b/BW_b)] \qquad \text{Eqn. (1)}$$

where $W_s$ is the thickness of slice 16, $W_b$ is the thickness of saturation bands 18, 24a and 24b, $BW_s$ is the frequency bandwidth of the slice and $BW_b$ is the frequency bandwidth of saturation bands 18, 24a and 24b.

The signs in Equation (1) are determined by the signs of the selection gradients for the SAT pulse ($W_b/BW_b$ term) and the imaging slice ($W_s/BW_s$ term). In normal use, the term in Equation (1) that represents the chemical shift of the SAT pulse often greatly exceeds the chemical shift of the imaging slice, i.e., $W_b/BW_b \gg W_s/BW_s$. If this condition holds, then the $W_s/BW_s$ term may be neglected. If the two terms are of comparable magnitude, then the complete Equation (1) should be considered. Hereinafter, except where expressly stated otherwise, it shall be assumed that the term $W_b/BW_b$ is substantially greater than $W_s/BW_s$.

As indicated above, it is always desirable to have $g_f$ less than $g_w$, to ensure that the band of fat saturation resulting from the SAT pulse will be sufficiently close to slice 16 to provide useful fat suppression. However, it will be seen from the plus/minus signs in Equation (1) that it is possible for $g_f$ to be greater than $g_w$. This situation is depicted in FIG. 1C, which shows the fat saturation band 24b, which is displaced away from slice 16, rather than toward the slice, by an amount $d_b$, along the Z axis. Generally, $d_b$ is equal to $d_a$. FIG. 1C shows band 24b centered at $Z_2$ relative to the Z-axis, where $Z_2$ is the location of the center of band 24b along such axis. Although the fat slice 26b is displaced in the same direction as fat saturation band 24b in FIG. 1C, the fat saturation gap $g_f'$ therebetween in this case is substantially greater than water saturation gap $g_w$. Whether the fat/water chemical shift term of Equation (1), that is, the rightmost term in brackets, is added to or subtracted from $g_w$ is determined by the sign of the SAT selection gradient, which in turn can depend on geometry factors, referred to above, such as the direction of the main magnetic field of the magnet used in the MR process, the orientation of the subject or patient with respect thereto, and the side of the slice 16 on which the saturation bands are located.

Referring to FIG. 1D, there is shown the saturation pulse applied in accordance with the principles of the invention, as described hereinafter, to saturate fat tissue in band 24a, that is, the band which is displaced toward slice 16 relative to band 18, rather than away therefrom. At the same time, the slice 16 excitation pulse is shown to excite fat in the slice 26b.

In order to excite slice 16 and water saturation band 18, a slice selection gradient must be provided, which is oriented in this example substantially along the Z-axis (main magnetic field direction). As is well known, the carrier frequency $F_{water}$ is a function of z, in accordance with the expression $F_{water} = \gamma(B_0 + G_z z)$. $\gamma$ is the gyromagnetic ratio, and $B_0$ is a constant value pertaining to the magnetic field of the associated magnet. Accordingly, $F_{water}$ is a linear function of z having a slope equal to the gradient $\gamma G_z$. Gradient $G_z$ may be of either polarity, that is, it may be positive or negative.

To determine the position of a fat saturation band along the Z axis in response to a water saturation pulse having a particular carrier frequency $F_{water}$, the frequency term $F_{fat}$ may be considered where $F_{fat} = F_{water} - F_{cs}$. Accordingly, $F_{fat} = \gamma(B_0 + G_z z) - F_{cs}$. Thus, the frequency $F_{fat}$ is likewise a linear function of z having a slope $\gamma G_z$.

Referring to FIG. 2, there are shown curves (1) and (2), curve (1) being a plot of $F_{water}$ versus z, i.e., position along the Z-axis, and curve (2) being a plot of $F_{fat}$ versus z. Curves (1) and (2) have positive slopes, indicating a positive polarity of gradient $G_z$.

In accordance with principles of the invention, FIG. 2 shows curve (1) passing through the Isocenter of the gradient magnetic field, that is, a position at the center of the gradient at which z is 0. Water saturation carrier frequency $F_{water}$ is set to a center frequency $F_{center}$ at such point, $F_{center}$ being the Larmor frequency of water at the center of the desired location of the band. Thus, the value of carrier frequency $F_{water}$ comprises the sum of center frequency $F_{center}$ and an offset term $F_{offset}$ measured therefrom. Accordingly, to generate a water saturation band located at a position $z_0$ along the Z axis, a SAT pulse having a carrier frequency $F_{center} + f_0$ will be generated, where $f_0$ is the specific value of the offset frequency corresponding to position $z_0$. It is seen from curve (2) of FIG. 2 that such carrier frequency would generate a fat saturation pulse at position $z_1$.

To illustrate the invention, it will be assumed that it has been determined in accordance with some criterion that a fat saturation pulse generated at $z_2$ is positioned in the wrong location relative to $z_0$ so that according to Equation (1) $g_f > g_w$. That is, it may be recognized that generating a fat saturation band at location $z_2$ relative to position $z_0$ would have the effect of moving the fat saturation pulse away from slice 16, as shown in FIG. 1C, rather than toward the slice, as shown in FIGS. 1B and 1D. Accordingly, it is desired to reconfigure the MR system to generate a SAT pulse which will both saturate a water band positioned at position $z_0$, while saturating fat in a band positioned at the location $z_1$ shown in FIG. 2.

Following the principles of the invention, this is achieved, in part, by reversing the polarity or sign of the gradient $G_z$ prior to generating the SAT pulse. The slope of the carrier frequency function $F_{water}$ is thereby reversed, as shown by curve (3) of FIG. 2. Curve 3 passes through the Isocenter in like manner with curve (1), and is therefore symmetrical thereto. Reversing the polarity of the gradient $G_z$ also reverses the slope of the function for $F_{fat}$, as shown by curve (4) of FIG. 2.

FIG. 2 shows that in order to generate a SAT pulse which will saturate water in a band located at $z_0$, a carrier frequency must be selected which is equal to the sum of the center frequency $F_{center}$ and an offset frequency $f_0'$. Because of the symmetry of curves (1) and (3), $f_0' = -f_0$. That is, the offset frequency used in connection with the reversed gradient to position the water saturation band at $z_0$ is equal in magnitude but opposite in sign or polarity to the offset frequency $f_0$ which would be used with a positive $G_z$ gradient.

Referring further to FIG. 2, and in particular to curve (4) thereof, it is seen that carrier frequency $F_{center} + f_0'$ will cause a band of fat saturation to be generated at the desired position $z_1$.

In order to determine whether an MR system must be adjusted as described above, in order to locate the fat saturation band at $z_1$, a trial imaging experiment could be conducted, wherein a SAT pulse would be generated at a carrier frequency $F_{center} + f_0$, in the presence of a positive gradient $G_z$. If a resulting image did not show sufficient fat suppression in the desired location, the experiment would be repeated, using a SAT pulse wherein polarity of the generated gradient and the offset frequency were respectively reversed.

Alternatively, the direction of movement of the fat saturation band relative to the water saturation band, for a positive gradient $G_z$ and offset frequency $f_0$, could be determined by imaging a phantom placed in the main magnet, prior to placing the patient therein. The phantom would be constructed to contain two materials placed proximate to each other having the same Larmor frequencies as water and fat, respectively. A SAT pulse of the specified gradient polarity and offset would be applied to the phantom to saturate respective bands of the first and second materials relative to one another. The results thereof would be observed to determine the direction of displacement of the band of second material relative to the first, along the Z-axis. While not shown, phantoms of such type are well known to those of skill in the art.

As a second alternative for determining the direction of movement of the fat saturation band relative to the water saturation band, anticipated values of $W_s$ and $BW_s$ associated with the slice 16 and of $W_b$ and $BW_b$ associated with saturation band 18 may be considered for a SAT pulse of carrier frequency $F_{center} + f_0$ and a positive gradient $G_z$. For the case $W_b/BW_b \gg W_s/BW_s$, referred to above, from Equation (1) $g_f$ will be greater than $g_w$, rather than less, if the term $W_b/BW_b$ is positive. Such condition accordingly indicates that the fat saturation band is displaced away from rather than toward slice 16, whereby the MR system must be adjusted in accordance with the invention, as described above.

The case where the terms $W_b/BW_b$ and $W_s/BW_s$ are of comparable magnitude is discussed hereinafter in connection with FIG. 4.

Figure 3:
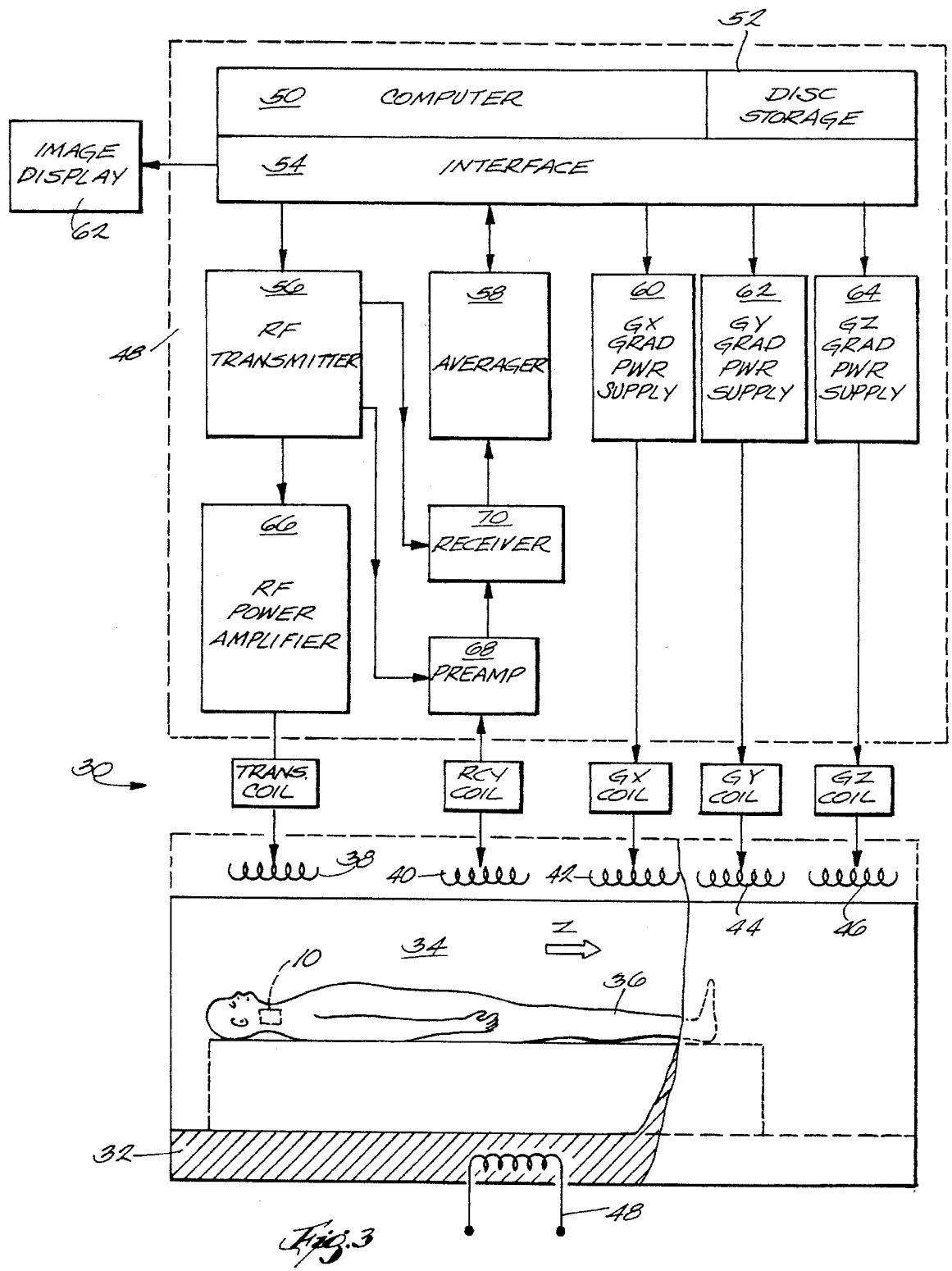
FIG. 3 is a diagram showing components of an MR imaging system for use in connection with an embodiment of the invention.

FIG. 3 shows the principal components of an MR imaging system 30, useful for practicing the present invention. System 30 includes a main magnet 32 provided with a bore 34 disposed to supportable receive a patient or other subject 36 for MR imaging of the volume 10, referred to above in connection with FIG. 1A.

MR system 30 further includes a transmit or RF excitation coil 38, a receive coil 40, $G_x$, $G_y$ and $G_z$ gradient coils 42, 44 and 46, respectively, and static main magnet coil 48. Each of the coils 38 and 42–48 is incorporated into magnet 32 so that when energized, they respectively project magnetic fields into bore 34 and subject 36. Receive coil 40 is likewise incorporated into magnet 32, to detect MR signals generated within subject 36.

Referring further to FIG. 3, there is shown MR system 30 further including MR system electronics 48, comprising components for selectively energizing coils 38, 42, 44 and 46, and for processing the MR data signals detected by receive coil 40. System electronics 48 includes a general purpose computer 50, which is interactively coupled to a disc storage 52 and an interface 54. An RF transmitter 56, a signal averager 58 and gradient power supplies 60, 62 and 64 are respectively coupled to computer 50 through interface 54 to enable computer 50 to control the respective operations thereof. Gradient power supplies 60, 62 and 64 respectively energize the Gx, Gy and Gz gradient coils 42, 44 and

46. RF transmitter 56 is coupled through an RF power amplifier 66 to energize transmit or excitation coil 38. Computer 50, acting through interface 54, selectively couples signals to the respective coil energizing components to generate pulse sequences, such as the sequence described hereinafter in connection with FIG. 4.

Computer 50 also controls the duration of an RF pulse generated by transmitter 56, as well as the amplification level of amplifier 66. Computer 50 can operate coil 38 to generate excitation pulses of selected flip angle.

MR electronics 48 further includes a low noise preamplifier 68, which receives and pre-amplifies respective MR data signals detected by coil 40. Pre-amplified data signals are applied to a receiver 70 for further amplification, direction and filtering. By means of the receiver 70, the signals are digitized for averaging by signal averager 58 and then coupled to computer 50 through interface 54.

Computer 40 performs data processing functions with respect to received MR data signals, such as Fourier transformation and image reconstruction. After processing of the received MR data signals has been completed, computer 40 couples a corresponding image reconstruction signal to a display 72 to provide an image in viewable form.

As is well known, a single coil can be substituted for transmit coil 18 and receive coil 20. In such modification, a switching mechanism is provided to alternately couple amplifier 56 and preamplifier 58 to such coil.

Figure 4:
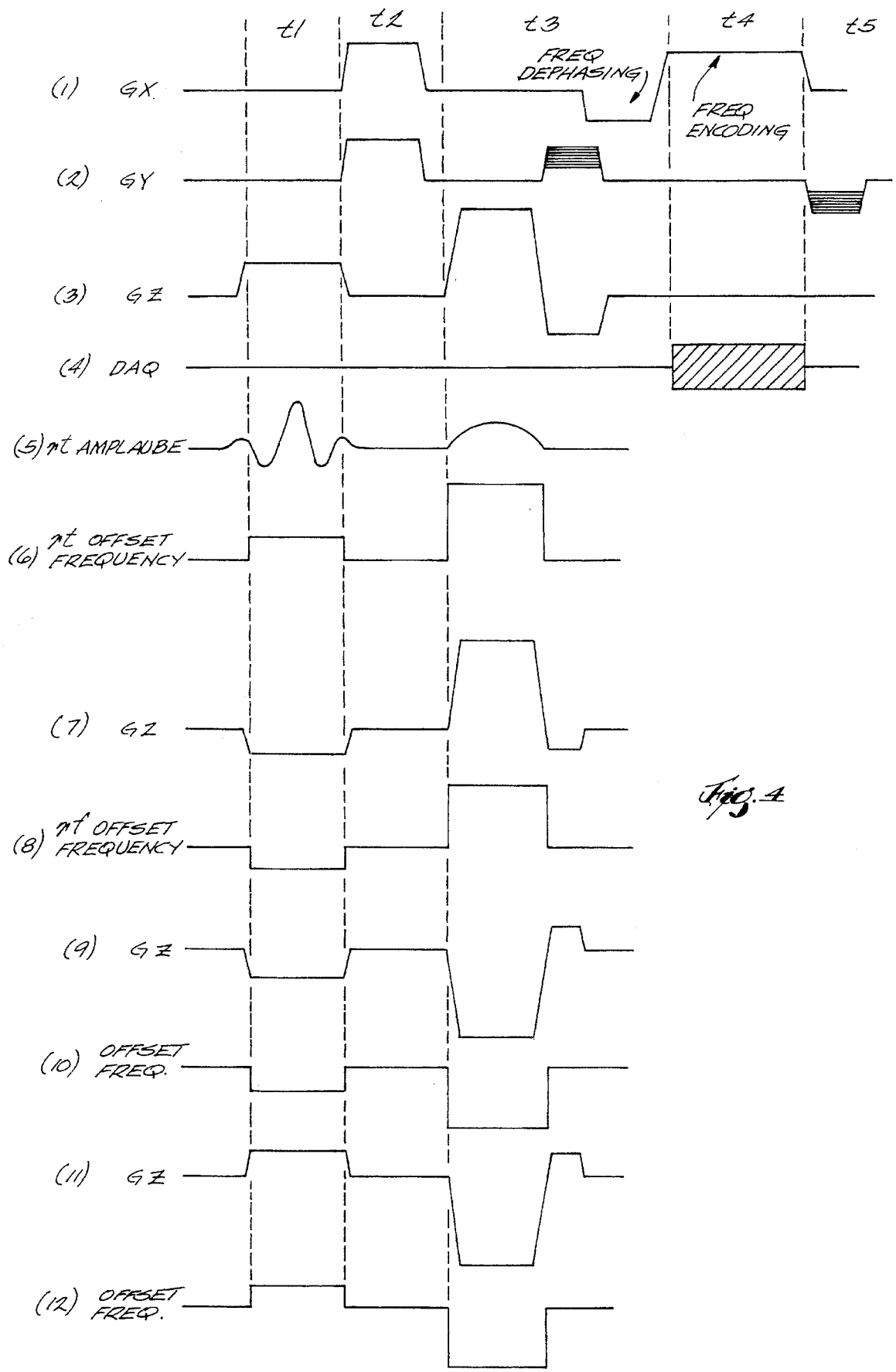
FIG. 4 shows an MR pulse sequence for the invention.

Referring to FIG. 4, there are shown lines (1)–(3), (5) and (6) which collectively depict the pulses respectively provided by RF excitation coil 38 and gradient coils 42–46 to generate saturated water and fat bands, such as bands 18 and 24b described above in connection with FIG. 1C, and also to excite slice 16. MR data acquired from excitation of slice 16, detected by receive coil 40, is depicted in line (4) of FIG. 4. More particularly, FIG. 4 shows respective pulses required for saturation as being generated during the time periods t1 and t2, and the pulses required to generate the excitation slice 16 as being generated during time periods t3 and t4.

During time period t1, the RF excitation pulse is generated by coil 38, line (5) of FIG. 4 showing the amplitude of the RF pulse and line (6) showing the offset frequency $f_0$ thereof. As stated above, the RF SAT pulse has a flip angle on the order of 90° or greater. The Z gradient $G_z$ is also generated during time period t1, line (3) indicating that $G_z$ is positive.

During time period t2, X-gradient ($G_x$) and Y-Gradient ($G_y$) dephasing pulses are generated, conventionally required as part of the saturation technique. Z-gradient dephasing pulses (not shown) are sometimes used in addition or alternatively.

FIG. 4 further shows that during time period t3, $G_z$, $G_y$ and $G_x$ gradient pulses, usefully comprising slice select, phase encoding and frequency dephasing pulses, respectively, are generated in accordance with a pulse sequence which is well known to those of skill in the art as spin warp imaging. In accordance with the gradient recalled echo technique, the polarity of the $G_x$ gradient is reversed to generate MR data, read out during a time period t4, from a slice 16. Lines (5) and (6) respectively show the amplitude and frequency of the RF excitation pulse applied to slice 16 during time period t3.

FIG. 4 also shows a $G_y$ rewinder pulse generated during time period t5, which may be useful in preparing the transverse magnetization for the following pulse sequence.

In the event it has been determined that use of a positive $G_z$ gradient and offset frequency $f_0$ result in fat saturation in a band being displaced further from slice 16 than the water saturation band, as described hereinbefore in connection with FIG. 2, the pulse sequences for saturation and slice excitation are revised in accordance with the invention by substituting the $G_z$ pulse sequence shown by line (7) of FIG. 4 for that of line (3), and the RF frequencies shown by line (8) for those of line (6). Accordingly, the $G_z$ gradient and offset frequency will be negative rather than positive during time period t1, when the SAT pulse is generated, but will still be positive during time period t3. It will be apparent that such pulse sequence revisions may be readily implemented by programming computer 50 of MR system 30 in accordance therewith to control operation of the coils 38–46.

In the event that the terms $W_b/BW_b$ and $W_s/BW_s$ are of comparable magnitude, the $F_{cs}$ term of Equation (1) may be positive even though the polarity of the SAT pulse $G_z$ gradient has been reversed in accordance with the invention. In this situation, to ensure that the $F_{cs}$ term is negative so that fat saturation gap $G_f$ will be smaller than the water saturation gap $G_w$, the polarity of the $G_z$ gradient may also be reversed during time period t3 in connection with the selection of the slice 16. Such reversal would require the RF offset frequency to likewise be reversed during the time period t3. This arrangement is shown by substituting the $G_z$ sequence of line (9) and the offset frequencies of line (10) for those of lines (3) and (6), respectively.

In a further modification shown by lines (11) and (12), which may be respectively substituted for lines (3) and (6) of FIG. (4), the polarities of $G_z$ and the RF offset frequency are positive in generating the SAT pulse, but are reversed in the slice excitation sequence. This has the effect of changing the sign of the term $W_s/BW_s$.

In another modification, a phantom is placed in the bore 34 of magnet 32, as referred to above. Pulse sequences using different combinations of negative $G_z$ gradient pulses and corresponding offset frequencies, as respectively shown by lines (7)–(8), (9)–(10) and (11)–(12) of FIG. 4 are applied to the phantom to determine the effects thereof in selectively positioning a fat saturation pulse with respect to the slice of interest, for various geometry factors. As stated above, these may include but are not limited to the direction of the main magnet field, the placement of the SAT band relative to the slice, the direction of patient entry into the magnet and the direction of gradient coil windings, which defines a standard polarity for the $G_z$ gradient. The results are stored in storage 52, and computer 50 is programmed in accordance therewith. Then, for a given imaging task the operator of MR system 30 enters selected geometry factors pertaining to the task into computer 50, which adjusts the polarities of selected $G_z$ gradient pulses and their corresponding offset frequencies to achieve a desired positional relation between the fat saturation band and the slice of interest.

Obviously, many other modifications and variations of the present invention are possible in light of the above teachings. It is therefore to be understood that within the scope of the disclosed inventive concept, the invention may be practiced otherwise than as specifically described.

What is claimed is:

1. In a system for MR imaging which includes a gradient means for establishing a gradient magnetic field and excitation means for generating RF excitation pulses, and wherein a volume within an imaging subject positioned with respect to said system contains water molecules and fat tissue proximate to one another, a method for selectively saturating water molecules and fat tissue in said volume comprising the steps of:

determining whether application of a first RF excitation pulse of a first RF frequency to said volume, in association with a gradient magnetic field having a selected polarity with respect to an axis, which saturates water molecules lying within a first band positioned at a specified location with respect to said axis, would saturate fat tissue lying within a second band which is spatially displaced along the axis from said specified location in a pre-specified direction, rather than in a direction opposite to said pre-specified direction, said first RF frequency comprising the sum of a center frequency and a first offset frequency having a magnitude and polarity determined by said gradient magnetic field; and if said first RF pulse would displace said second band in said direction opposite to said pre-specified direction, reversing the polarity of said gradient magnetic field from said selected polarity, and operating said excitation means to apply a second RF pulse of a second RF frequency to said volume to saturate water molecules lying within said first band, and also to saturate fat tissue lying within a third band which is spatially displaced along said axis from said specified location in said pre-specified direction, said second RF frequency comprising the sum of said center frequency and a second offset frequency having a magnitude equal to the magnitude of said first offset frequency and a polarity opposite to the polarity thereof.

2. The method of claim 1 wherein:

said pre-specified direction comprises the direction oriented along said axis from said specified location toward the location of a slice of interest in MR imaging which is to be taken through said subject.

3. The method of claim 2 wherein:

said third band of saturated fat tissue is within on the order of 10 millimeters of said slice.

4. The method of claim 2 wherein:

said method includes the step of generating a pulse sequence following application of said second RF pulse to excite said slice to acquire data relating to blood flow therethrough.

5. The method of claim 2 wherein:

said method includes the step of generating a pulse sequence following application of said second RF pulse to excite said slice to acquire data for a two-dimensional time of flight MR angiographic process.

6. The method of claim 1 wherein:

said determining step includes applying said first pulse to said volume to saturate fat tissue lying within said second band, and then acquiring MR data resulting from said first excitation pulse to indicate the direction of displacement of said second band from said specified location.

7. The method of claim 1 wherein:

said determining step includes applying said first excitation pulse to a phantom including first and second materials proximate to each other which respectively have the same Larmor frequencies as water and fat, and to thereby saturate a band of first material and a band of second material positioned with respect to each other and to said axis, and then determining the direction in which said band of saturated second material is displaced from said band of first material.

8. In a system for MR imaging wherein a volume within an imaging subject positioned with respect to said system contains water molecules and fat tissue proximate to one another, a method for exciting a slice of interest in said volume and for saturating bands of water molecules and fat tissue in said volume so that said bands are selectively positioned with respect to said slice and to each other, said method comprising the steps of:

specifying a first gradient magnetic field and a first RF carrier frequency for prospective use in generating said saturated bands, said first gradient magnetic field having a specified polarity with respect to an axis, said first RF frequency comprising the sum of a center frequency and a first offset frequency having a magnitude and polarity determined by said first gradient magnetic field, said first gradient magnetic field and said first offset frequency comprising the parameters of a first parameter set;

specifying a second gradient magnetic field and a second RF carrier frequency for prospective use in generating said slice, said second gradient magnetic field having a specified polarity with respect to an axis, said second RF frequency comprising the sum of a center frequency and a second offset frequency having a magnitude and polarity determined by said second gradient magnetic field, said second gradient magnetic field and said second offset frequency comprising the parameters of a second parameter set;

computing first and second terms, respectively comprising the width of said water molecule band divided by the frequency bandwidth thereof, and the width of said slice divided by the frequency bandwidth thereof;

determining whether the sum of said first and second terms is positive or negative; and in the event said sum is positive, reversing the polarities of the parameters of at least one of said parameter sets, and using said parameters of reversed polarity in applying respective MR pulse sequences to said volume to excite said slice and to saturate said bands so that said band of saturated fat tissue is closer to said slice than said saturated band of water molecules.

9. The method of claim 8 wherein:

the polarities of the parameters of both of said parameter sets are reversed.

10. The method of claim 8 wherein:

the polarities of the parameters only of said first parameter set are reversed.

11. The method of claim 8 wherein:

the polarities of the parameters only of said second parameter set are reversed.

12. In an MR imaging system, wherein a volume within an imaging subject positioned with respect to an axis defined by said system contains water molecules and fat tissue proximate to one another, apparatus for selectively saturating bands of water molecules and fat tissue and exciting a slice of interest in said volume comprising:

gradient means for generating gradient pulses of variable polarity proximate to said volume, one polarity of said gradient pulses comprising a standard polarity for said system;

excitation means for applying an RF excitation pulse of a first RF frequency to said volume in association with a first one of said gradient pulses having a first polarity, to saturate water molecules in a first band and fat tissue in a second band, and for applying an RF excitation pulse of a second RF frequency to said volume in association with a second one of said gradient pulses having a second polarity to excite said slice, said first RF frequency comprising the sum of a center frequency and a first offset frequency having a polarity corresponding to said first polarity of said first gradient pulse, said second RF frequency comprising the sum of a center frequency and a second offset frequency having a polarity corresponding to said second polarity of said second gradient pulse; and means for receiving input data representing one or more specified geometry factors, and for selecting the respective polarities of said first and second gradient pulses, and the polarities of said first and second offset frequencies respectively corresponding thereto, in response to said input data to position said second band of saturated fat tissue within a specified position relative to said slice, the polarity of at least one of said first and second gradient pulses being reversed from said standard polarity.

13. The apparatus of claim 12 wherein:

the polarities of both said first and second gradient pulses and offset frequencies are reversed from said standard polarity.

14. The apparatus of claim 12 wherein:

the polarity only of said first gradient pulse is reversed from said standard polarity.

15. The apparatus of claim 12 wherein:

the polarity only of said second gradient pulse is reversed from said standard polarity.

16. The apparatus of claim 12, wherein said MR system includes a main magnet contains at least a portion of said subject which includes said volume, a static magnetic field being generated in said main magnet, wherein said gradient means comprises a gradient coil, and wherein:

said geometry factors are selected from a set which includes the direction of said static magnetic field, the position of said first band of saturated water molecules relative to said slice, the direction of the windings of said gradient coil, and the position of said volume of said subject relative to said main magnet and said gradient coil.

* * * * *